(12) United States Patent
Yonezawa

(10) Patent No.: US 10,190,758 B2
(45) Date of Patent: Jan. 29, 2019

(54) LIGHT SOURCE DEVICE, DISPLAY APPARATUS, METHOD OF MANUFACTURING SUBSTRATE UNIT AND METHOD OF MANUFACTURING LIGHT SOURCE DEVICE

(71) Applicant: Sakai Display Products Corporation, Sakai-shi, Osaka (JP)

(72) Inventor: Nobuhiro Yonezawa, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 15/568,163

(22) PCT Filed: Apr. 22, 2015

(86) PCT No.: PCT/JP2015/062261
§ 371 (c)(1),
(2) Date: Oct. 20, 2017

(87) PCT Pub. No.: WO2016/170621
PCT Pub. Date: Oct. 27, 2016

(65) Prior Publication Data
US 2018/0135841 A1    May 17, 2018

(51) Int. Cl.
| | | |
|---|---|---|
| *F21S 4/20* | (2016.01) | |
| *F21S 2/00* | (2016.01) | |
| *F21V 23/00* | (2015.01) | |
| *G02F 1/1335* | (2006.01) | |
| *H05K 1/02* | (2006.01) | |

(52) U.S. Cl.
CPC ............ *F21V 23/003* (2013.01); *F21S 2/005* (2013.01); *F21S 4/20* (2016.01); *G02F 1/133603* (2013.01); *H05K 1/028* (2013.01)

(58) Field of Classification Search
CPC ........ H05K 1/117; H05K 1/028; H05K 1/148; H05K 1/118; H05K 1/147; H05K 1/189; F21V 23/003; F21V 23/06; F21S 4/20; F21S 2/005; G02F 1/133603
See application file for complete search history.

(56) References Cited

U.S. PATENT DOCUMENTS

| | | | | | |
|---|---|---|---|---|---|
| 6,139,360 | A | * | 10/2000 | Hayashi | ................. H05K 1/148 439/502 |
| 8,207,664 | B2 | * | 6/2012 | Kawachi | ............. H01L 51/5203 313/483 |

(Continued)

FOREIGN PATENT DOCUMENTS

| | | |
|---|---|---|
| JP | 2006-296678 A | 11/2006 |
| JP | 2013-222608 A | 10/2013 |
| WO | WO2008090843 A1 | 7/2008 |

*Primary Examiner* — Anh Mai
*Assistant Examiner* — Arman B Fallahkhair
(74) *Attorney, Agent, or Firm* — Rudy J. Ng; Bret E. Field; Bozicevic, Field & Francis LLP

(57) ABSTRACT

The light source device includes a pair of elongated light source substrates on which light sources are mounted, and a connection substrate which has a flexibility and connects end parts of the respective light source substrates. The connection substrate has a bent part which is bent along each direction intersecting the connection substrate. Each intersecting direction may be, for example, a lateral direction and a longitudinal direction of the light source substrate.

11 Claims, 8 Drawing Sheets

(56) References Cited

U.S. PATENT DOCUMENTS

| | | | |
|---|---|---|---|
| 8,882,330 B2 * | 11/2014 | Byun | F21S 8/00 362/249.04 |
| 9,019,171 B2 * | 4/2015 | Wang | G06F 1/1601 345/1.3 |
| 9,854,675 B2 * | 12/2017 | Pouget | H05K 1/148 |
| 2006/0244177 A1 | 11/2006 | Kaneto et al. | |
| 2010/0103649 A1 * | 4/2010 | Hamada | H05K 1/118 362/97.1 |
| 2015/0049485 A1 | 2/2015 | Kamitani | |

* cited by examiner

F I G. 2
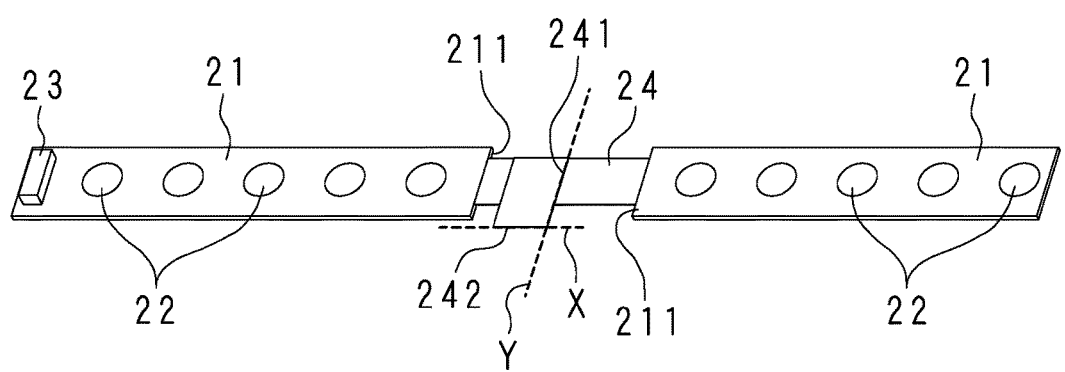

LIGHT SOURCE DEVICE, DISPLAY APPARATUS, METHOD OF MANUFACTURING SUBSTRATE UNIT AND METHOD OF MANUFACTURING LIGHT SOURCE DEVICE

CROSS-REFERENCE TO RELATED APPLICATIONS

This application is the national phase under 35 U.S.C. § 371 of PCT International Application No. PCT/JP2015/062261 which has an International filing date of Apr. 22, 2015 and designated the United States of America.

FIELD

The present invention relates to a light source device including light source substrates having light sources mounted thereon, a display apparatus including the light source device, a method of manufacturing a substrate unit, and a method of manufacturing the light source device.

BACKGROUND

A liquid crystal display apparatus includes a liquid crystal display panel, a backlight and the like. As the backlight, for example, there is a direct light type in which an LED substrate having light emitting diodes (LEDs) mounted thereon and a diffusion plate for diffusing light from the LEDs are provided on a rear surface side of the liquid crystal display panel, and an optical sheet is provided on a front surface of the diffusion plate, or an edge light type which includes a light guide plate disposed on the rear surface side of the liquid crystal display panel through an optical sheet, and an LED substrate disposed to face an end face of the light guide plate.

In recent years, as a size of the liquid crystal display apparatus has become larger, in order to mount a plurality of LEDs, the LED substrate should be elongated. However, a length of the LED substrate is limited due to constraints on a production apparatus and the like. Therefore, a light source module, in which two LED substrates are linearly disposed, and the respective LED substrates are connected by a relay connector, thereby elongating the LED substrate, has been disclosed (see Japanese Patent Laid-open Publication No. 2013-222608).

SUMMARY

In the light source module of Japanese Patent Laid-open Publication No. 2013-222608, since many relay connectors are used for connecting the LED substrates, a probability for conduction failure of contact pins of the relay connector occurring due to vibration, thermal expansion of the LED substrate, or the like is raised.

In addition, by using many relay connects, it also causes an increase in costs.

In consideration of the above-described circumstances, it is an object of the present disclosure to provide a light source device capable of elongating LED substrates without using a relay connector, a display apparatus including the light source device, a method of manufacturing a substrate unit, and a method of manufacturing the light source device.

A light source device according to the present disclosure includes a pair of elongated light source substrates on which light sources are mounted, and a connection substrate which has a flexibility and connects end parts of the respective light source substrates, wherein the connection substrate has a bent part which is bent along each direction intersecting the connection substrate.

According to the present disclosure, the light source device includes the pair of elongated light source substrates on which the light sources are mounted, and the connection substrate which has a flexibility and connects the end parts of the respective light source substrates. Since the end parts of the pair of light source substrates are connected by the connection substrate, the pair of light source substrates may be linearly disposed to be elongated. The connection substrate has the bent part which is bent along each direction intersecting the connection substrate. Each intersecting direction may be, for example, a lateral direction and a longitudinal direction of the light source substrate.

If a bent part which is bent along the longitudinal direction of the light source substrate among the bent parts is returned to its original position, it is possible to dispose the pair of light source substrates at positions in which respective diagonal lines thereof are on substantially the same imaginary straight line as each other. Further, if a bent part which is bent along the lateral direction of the light source substrate is returned to its original position, long side edge parts of the pair of light source substrates may be disposed at positions facing each other. That is, a substrate unit (including the pair of light source substrates and the connection substrate), in which the respective light source substrates are disposed so that the long side edge parts of the pair of light source substrates face each other, and the end parts of the respective light source substrates are connected by the connection substrate, is fabricated. Since the substrate unit is disposed so that the long side edge parts of the light source substrates face each other, the substrate unit is not elongated. Then, by bending the connection substrate (for example, by about 180 degrees) along the lateral direction and the longitudinal direction of the light source substrate, the pair of light source substrates may be linearly disposed through the connection substrate, and the light source substrates may be elongated without using a relay connector.

A light source device according to the present disclosure, wherein the connection substrate has respective extension parts which extend to be connected to short side edge parts of the respective light source substrates, and a connection part which connects the respective extension parts, in a state before bending, and the bent part has a first bent part formed by bending one extension part along a lateral direction of the light source substrate, and a second bent part formed by bending the connection part along a longitudinal direction of the light source substrate.

According to the present disclosure, the connection substrate has the respective extension parts which extend to be connected to the short side edge parts of the respective light source substrates, and the connection part which connects the respective extension parts, in the state before bending. That is, the connection substrate has the connection part along the lateral direction of the light source substrate, and the respective extension parts connected from both sides of the connection part, and is formed in a U shape in a plan view, in the state before bending. The bent part has the first bent part formed by bending one extension part along the lateral direction of the light source substrate, and the second bent part formed by bending the connection part along the longitudinal direction of the light source substrate.

In a state in which the long side edge parts of the light source substrates are connected to each other through the connection substrate (in the state of before bending), first, the extension part connected to one light source substrate is bent (by about 180 degrees) in the lateral direction of the light source substrate to form the first bent part. Thereby, the light source substrates may be disposed at the positions in which the respective diagonal lines thereof are on substantially the same imaginary straight line as each other. Next, the connection part is bent (by about 180 degrees) along the longitudinal direction of the light source substrate to form the second bent part. Thereby, the light source substrates may be linearly disposed with the connection substrate in between, and the light source substrates may be elongated.

A light source device according to the present disclosure, wherein lengths of the respective extension parts in the longitudinal direction are different from each other.

According to the present disclosure, the lengths of the respective extension parts in the longitudinal direction are different from each other. That is, the connection substrate is formed in a J shape in a plan view, in the state before bending. By shortening the length of one extension part (which does not have a bent part) than the length of the other extension part having a first bent part, a spaced dimension therebetween in the longitudinal direction of the light source substrates may be adjusted (shortened).

A light source device according to the present disclosure, wherein the connection substrate has an extension part which extends to be connected to a short side edge part of one light source substrate, and a connection part which connects the extension part and a short side of a long side edge part of the other light source substrate part, in a state before bending, the bent part has a first bent part formed by bending the extension part along the lateral direction of the light source substrate, and a second bent part formed by bending the connection part along the longitudinal direction of the light source substrate.

According to the present disclosure, the connection substrate has the extension part which extend to be connected to the short side edge part of one light source substrate, and the connection part which connects the extension part and the short side of the long side edge part of the other light source substrate part, in the state before bending. That is, in the state before bending, the connection substrate has the connection part along the lateral direction of the light source substrate, and the extension part connected from one end side of the connection part, wherein the extension part is connected to the short side edge part of one light source substrate, and the connection part is connected to the short side of the long side edge part of the other light source substrate, and is formed in an L shape in a plan view. The bent part has the first bent part formed by bending one extension part along the lateral direction of the light source substrate, and the second bent part formed by bending the connection part along the longitudinal direction of the light source substrate.

In a state in which the long side edge parts of the light source substrates are connected to each other through the connection substrate (in the state of before bending), first, the extension part connected to one light source substrate is bent (by about 180 degrees) in the lateral direction of the light source substrate to form the first bent part. Thereby, the light source substrates may be disposed at the positions in which the respective diagonal lines thereof are on substantially the same imaginary straight line as each other. Next, the connection part is bent (by about 180 degrees) along the longitudinal direction of the light source substrate to form the second bent part. Thereby, the light source substrates may be linearly disposed with the connection substrate in between, and the light source substrates may be elongated. In addition, since the connection part is connected to the short side of the long side edge part of the other light source substrate, the spaced dimension in the longitudinal direction of the light source substrate may be more shortened than the case of being connected to the short side edge part of the light source substrate.

A light source device according to the present disclosure, wherein the connection substrate connects the respective light source substrates so that the long side edge parts of the respective light source substrates face each other, in the state before bending.

According to the present disclosure, the connection substrate connects the respective light source substrates so that the long side edge parts of the respective light source substrates face each other, in the state before bending. In the state before bending, since the long side edge parts of the light source substrates are disposed so as to face each other, the light source substrates are not elongated. Then, if fabricating the substrate unit in which the respective light source substrates are disposed so that the long side edge parts of the pair of light source substrates face each other, and the end parts of the respective light source substrates are connected by the connection substrate, it is also possible to suppress a size of a production apparatus of the substrate from becoming larger without being restricted by the production apparatus.

A display apparatus according to the present disclosure includes the light source device according to any one of the present invention, and a display panel configured to transmit light emitted by the light source device.

According to the present disclosure, the display apparatus includes the light source device and the display panel configured to transmit the light emitted by the light source device. Thereby, it is possible to achieve a display apparatus that may elongate the light source substrate without using a relay connector.

A method of manufacturing a substrate unit according to the present disclosure includes the step of forming a plurality of elongated light source substrates on a substrate so that long side edge parts of the respective light source substrates face each other, the step of mounting light sources on the light source substrates, the step of connecting end parts of adjacent respective light source substrates formed on the substrate by a connection substrate which has a flexibility and is bendable along each direction intersecting the same, and the step of separating the respective light source substrates from the substrate.

According to the present disclosure, the method of manufacturing a substrate unit (including the pair of light source substrates and the connection substrate) includes the steps of: forming the plurality of elongated light source substrates on the substrate so that long side edge parts of the respective light source substrates face each other; mounting the light sources on the light source substrates; connecting the end parts of the adjacent respective light source substrates formed on the substrate by the connection substrate which has a flexibility and is bendable along each direction intersecting the same; and separating the respective light source substrates from the substrate.

When forming the light source substrates on the substrate, since the long side edge parts of the pair of light source substrates are disposed so as to face each other, there is no need to increase the size of the production apparatus of the substrate (for example, a mother board) when fabricating the light source substrates. In addition, in the substrate unit, since the end parts of each of the pair of light source substrates are connected by the connection substrate having a flexibility, by bending the connection substrate of the fabricated substrate unit along a required direction, it is possible to elongate the light source substrates without using a relay connector.

A method of manufacturing a light source device according to the present disclosure, the method of manufacturing a light source device which uses a substrate unit, in which end parts of respective light source substrates are connected by a connection substrate having a flexibility, so that long side edge parts of a pair of elongated light source substrates on which light sources are mounted face each other, the method includes the step of bending the connection substrate along one direction of a lateral direction and a longitudinal direction of the light source substrate, the step of bending the connection substrate which is bent in the above step along the other direction of the lateral direction and the longitudinal direction of the light source substrate, and the step of fixing the connection substrate which is bent in the above step and the light source substrates connected by the connection substrate to a prescribed fixing plate.

According to the present disclosure, the method of manufacturing a light source device uses the substrate unit, in which the end parts of the respective light source substrates are connected by the connection substrate having a flexibility, so that the long side edge parts of the pair of the elongated light source substrates on which the light sources are mounted face each other. The method of manufacturing a light source device includes the steps of bending the connection substrate along one direction (for example, the lateral direction) of the lateral direction and the longitudinal direction of the light source substrate; bending the connection substrate which is bent in the above step along the other direction (for example, the longitudinal direction) of the lateral direction and the longitudinal direction of the light source substrate; and fixing the connection substrate which is bent in the above step and the light source substrates connected by the connection substrate to the prescribed fixing plate.

By bending the connection substrate along the lateral direction of the light source substrate, the pair of light source substrates whose long side edge parts face each other may be disposed at the positions in which the respective diagonal lines thereof are on substantially the same imaginary straight line as each other. Next, by bending the connection substrate (for example, by about 180 degrees) along the longitudinal direction of the light source substrate, it is possible to linearly dispose the light source substrates with the connection substrate in between, and elongate the light source substrates.

According to the present disclosure, it is possible to elongate the LED substrate without using a relay connector.

The above and further objects and features of the invention will more fully be apparent from the following detailed description with accompanying drawings.

BRIEF DESCRIPTION OF THE DRAWINGS

FIG. 2 is an explanatory view illustrating an example of a configuration of a substrate unit of the present embodiment.

DETAILED DESCRIPTION

Figure 1:
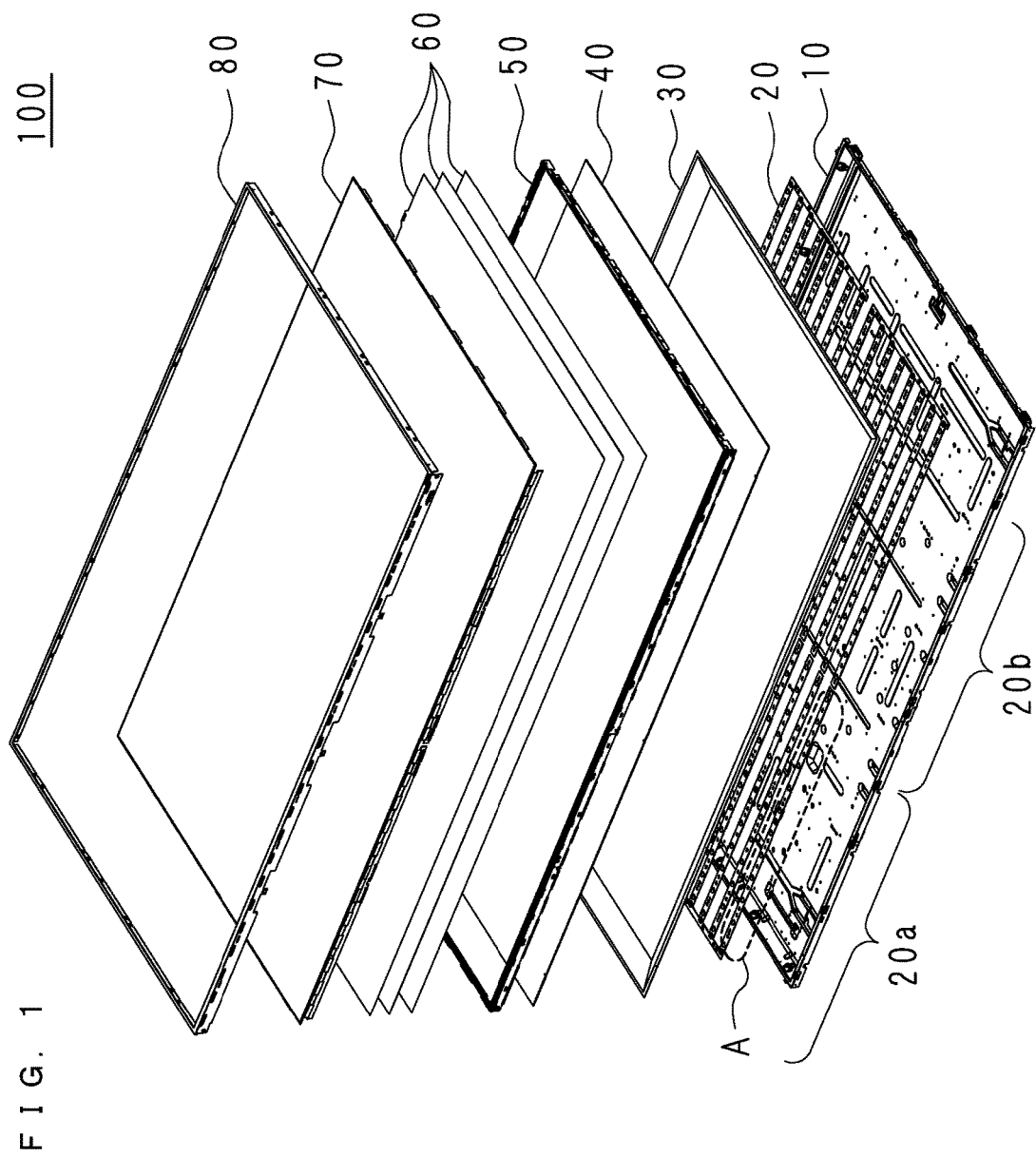
FIG. 1 is an exploded perspective view of major parts illustrating an example of a configuration of a display apparatus according to the present embodiment.

Hereinafter, the present invention will be described with reference to the accompanying drawings illustrating embodiments thereof. FIG. 1 is an exploded perspective view of major parts illustrating an example of a configuration of a display apparatus 100 according to the present embodiment. Further, hereinafter, as a backlight, a direct light type is described, but the backlight may be of an edge light type. The display apparatus 100 includes a display panel 70 having a display surface on one surface (a front surface), an optical sheet 60 and a diffusion plate 40 which are disposed to face a rear surface side of the display panel 70, a plurality of LED substrates 20 which are disposed on a side of the diffusion plate 40 opposite to the display panel 70 side, and have light emitting diodes (LEDs) mounted thereon, a reflection sheet 30 disposed on the rear surface side of the diffusion plate 40 so as to surround the LED substrate 20, a backlight chassis 10 for holding the diffusion plate 40, the reflection sheet 30 and the LED substrate 20, a panel chassis 50 for holding the display panel 70, a bezel 80 for covering peripheral edge parts of the display panel 70 and side faces of the panel chassis 50 and the like. Further, the light source device (for example, the backlight unit) of the present embodiment includes at least the LED substrate 20 and the backlight chassis 10.

The display panel 70 has glass substrates on one surface (a front surface) and the other surface (a rear surface) thereof, and a liquid crystal material is sealed between a pair of glass substrates. By applying a voltage to a driver for driving each pixel of the display panel 70, transmittance of light determined by electro-optical characteristics of the liquid crystal material may be changed, and by controlling an amount of light transmitting through the display panel 70 for each pixel, an image with gradations may be displayed.

The diffusion plate 40 is formed in a rectangular shape, and has vertical and horizontal dimensions substantially the same as those of the display panel 70. The diffusion plate 40 diffuses light from the LEDs disposed on the rear surface side thereof to irradiate the rear surface side of the display panel 70 with uniform light. The material of the diffusion plate 40 may be, for example, an acrylic resin, a polycarbonate resin, or the like, but it is not limited thereto. The optical sheet 60 is disposed on one side of the diffusion plate 40 on the display panel side.

The optical sheet 60 is formed in a rectangular shape having slightly smaller dimensions than those of the display panel 70. The optical sheet 60 includes an optical sheet having a light diffusion function and one or a plurality of optical sheets having a light collection function, which are laminated with each other.

The reflection sheet 30 reflects light emitted from the LEDs to become incident inside of the diffusion plate 40.

The backlight chassis 10 has vertical and horizontal dimensions substantially the same as those of the display panel 70, and is disposed so as to cover the rear surface side of the diffusion plate 40 with the LED substrate 20 and the reflection sheet 30 in between.

In the LED substrate 20, a plurality of light source substrates are disposed in a vertical-horizontal matrix shape. In the example of FIG. 1, a total of 64 (=16 vertical×4 horizontal) light source substrates are disposed. In FIG. 1, the light source substrates of a left half illustrated by reference numeral 20a and the light source substrates of a right half illustrated by reference numeral 20b may be separately and independently driven (right and left dividedly driven). Further, the number and an arrangement of light source substrates are not limited to the example of FIG. 1. Next, a substrate unit including a connection substrate for connecting a pair of light source substrates and the light source substrates will be described.

FIG. 2 is an explanatory view illustrating an example of a configuration of the substrate unit of the present embodiment. The substrate unit exemplified in FIG. 2 is an enlarged part of a place illustrated by a symbol A in FIG. 1. The substrate unit includes a pair of elongated light source substrates 21 on which LEDs 22 are mounted as a light source, a connection substrate 24 for connecting short side edge parts 211 (end parts) of the respective light source substrates 21 and the like. One light source substrate 21 is provided with a power supply connector 23 for supplying power to the LEDs 22. Further, five LEDs 22 are mounted on each light source substrate 21, but the number of LEDs 22 is not limited to the example in FIG. 2.

The connection substrate 24, which is made of, for example, a polyimide (PI) resin film, has a flexibility, and connects the short side edge parts 211 of the respective light source substrates 21. More specifically, the end part of the connection substrate 24 is soldered to the end part of the light source substrate 21. In addition, the light source substrate 21 and the connection substrate 24 may be connected by using an anisotropic conductive film (ACF).

The connection substrate 24 has a bent part which is bent by about 180 degrees along each direction intersecting the connection substrate 24. Each of the intersecting directions may be set to, for example, a lateral direction (direction illustrated by a symbol Y in FIG. 2) and a longitudinal direction (direction illustrated by a symbol X in FIG. 2) of the light source substrate 21. That is, the bent part has a first bent part 241 formed by bending the connection substrate 24 along the lateral direction of the light source substrate 21 and a second bent part 242 formed by bending the connection substrate 24 along the longitudinal direction of the light source substrate 21.

Since the connection substrate 24 is easily bent by the first bent part 241 and the second bent part 242, thicknesses of the first bent part 241 and the second bent part 242 may be made thinner than those of the other parts. In addition, the above-described about 180 degrees may be set to be 180 degrees, or slightly smaller than 180 degrees to an extent required to bend.

If the second bent part 242 which is bent by about 180 degrees along the longitudinal direction of the light source substrate 21 among the bent parts is returned to its original position, it is possible to dispose the pair of light source substrates 21 at positions in which respective diagonal lines thereof are on substantially the same imaginary straight line as each other. Further, if the first bent part 241 which is bent by about 180 degrees along the lateral direction of the light source substrate 21 is returned to its original position, long side edge parts 212 of the pair of light source substrates 21 may be disposed at positions facing each other.

That is, the substrate unit (including the pair of light source substrates 21 and the connection substrate 24), in which the respective light source substrates 21 are disposed so that the long side edge parts 212 of the pair of light source substrates 21 face each other, and the end parts of the respective light source substrates 21 are connected by the connection substrate 24, is fabricated. Since the substrate unit is disposed so that the long side edge parts 212 of the light source substrates 21 face each other, the light source substrates are not elongated. Then, by bending the connection substrate 24 by about 180 degrees along the lateral direction and the longitudinal direction of the light source substrate 21, the pair of light source substrates 21 may be linearly disposed through the connection substrate 24 as illustrated in FIG. 2, and the light source substrates may be elongated (in the example of FIG. 2, it is assumed that the light source substrates have a length about twice of an actual length of one light source substrate 21) without using a relay connector.

Next, a method of bending the connection substrate 24 of the substrate unit to elongate the light source substrates 21 will be described in detail.

Figure 3A:
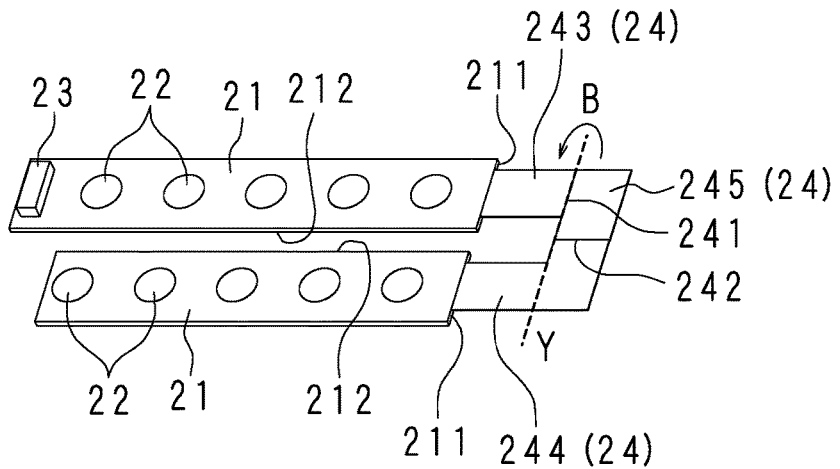
FIG. 3A is an explanatory view illustrating an example of a bending procedure of a first example of the substrate unit of the present embodiment.
Figure 3B:
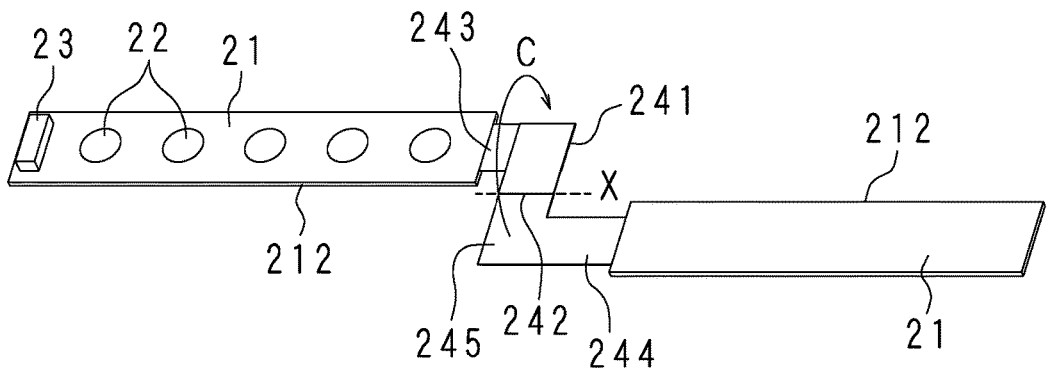
FIG. 3B is an explanatory view illustrating an example of the bending procedure of the first example of the substrate unit of the present embodiment.
Figure 3C:
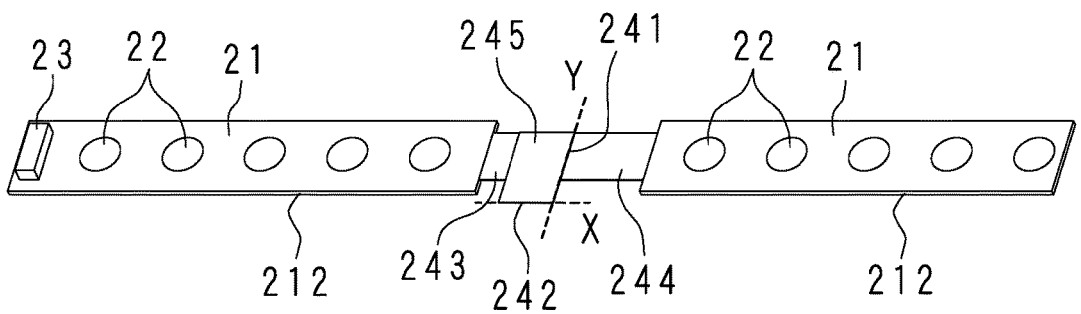
FIG. 3C is an explanatory view illustrating an example of the bending procedure of the first example of the substrate unit of the present embodiment.

FIGS. 3A, 3B and 3C are explanatory views illustrating an example of a bending procedure of the first example of the substrate unit of the present embodiment, respectively. FIG. 3A illustrates the substrate unit in a state before bending. As illustrated in FIG. 3A, the connection substrate 24 has extension parts 243 and 244 which extend to be connected to the respective short side edge parts 211 of the light source substrates 21, and a connection part 245 which connects the respective extension parts 243 and 244, in the state before bending.

That is, in the state before bending, the connection substrate 24 has the connection part 245 along the lateral direction of the light source substrate 21 and the respective extension parts 243 and 244 connected from both sides of the connection part 245, and is formed in a U shape in a plan view. One extension part 243 has a first bent part 241 that may be bent along the lateral direction (a direction illustrated by a symbol Y in FIG. 3A) of the light source substrate 21, and the connection part 245 has the second bent part 242 that may be bent along the longitudinal direction (a direction illustrated by a symbol X in FIG. 3B) of the light source substrate 21.

The connection substrate 24 connects the respective light source substrates 21 so that the long side edge parts 212 of the respective light source substrates 21 face each other, in the state before bending. In the state before bending, since the long side edge parts 212 of the light source substrates 21 are disposed so as to face each other, the light source substrates are not elongated. Then, if fabricating the substrate unit in which the respective light source substrates 21 are disposed so that the long side edge parts 212 of the pair of light source substrates 21 face each other, and the short side edge parts 211 (end parts) of the respective light source substrates 21 are connected by the connection substrate 24, it is also possible to suppress a size of a production apparatus of the substrate from becoming larger without being restricted by the production apparatus.

Figure 4:
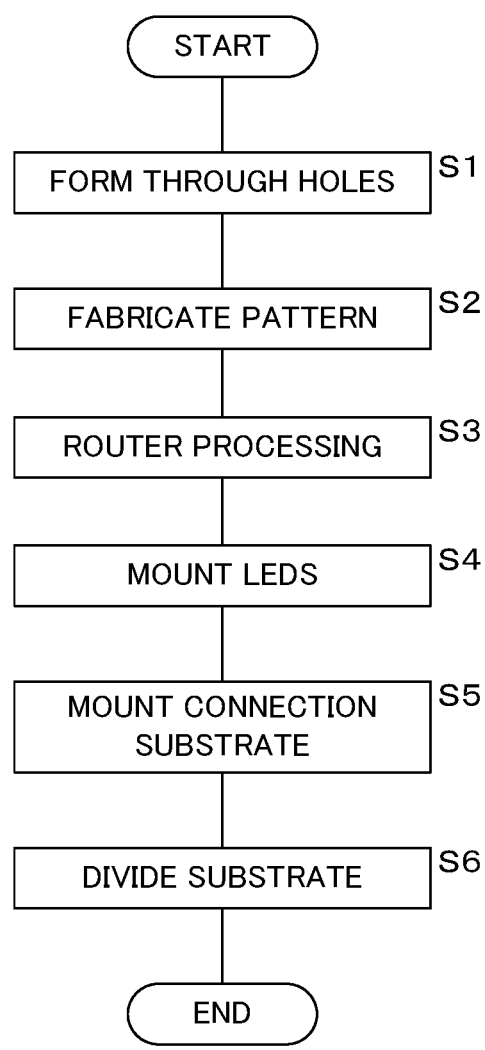
FIG. 4 is a process chart illustrating an example of a method of manufacturing a substrate unit of the present embodiment.

FIG. 4 is a process chart illustrating an example of a method of manufacturing the substrate unit of the present embodiment. The process chart illustrated in FIG. 4 is an example of the method of manufacturing the substrate unit illustrated in FIG. 3A. As illustrated in FIG. 4, through holes are formed in a substrate (for example, made of a glass epoxy resin, etc.) as a mother board (S1), and a pattern for a light source substrate is fabricated (S2). Further, the mother board (substrate) has a size to an extent that a plurality of light source substrates may be cut out.

Router processing is performed to cut out the light source substrates from the substrate (S3), and LEDs are mounted at prescribed positions within a region corresponding to the light source substrates on the substrate (S4). A connection substrate is mounted (for example, soldered) (S5) to connect the short sides of adjacent light source substrates, and the substrate is divided (S6) to cut out a substrate unit including a pair of light source substrates and the connection substrate which connects the light source substrates. By the above-described processes, the substrate unit illustrated in FIG. 3A may be manufactured. Further, characteristics (for example, luminance, shade, etc.) of the LED are measured for each substrate unit to specify a rank, and labels having the specified rank are attached to prescribed positions of the substrate unit.

As described above, when forming the light source substrates 21 on the substrate, since the long side edge parts 212 of the pair of light source substrates 21 are disposed so as to face each other, there is no need to increase the size of the production apparatus of the substrate (for example, the mother board) when fabricating the light source substrates 21.

Figure 5:
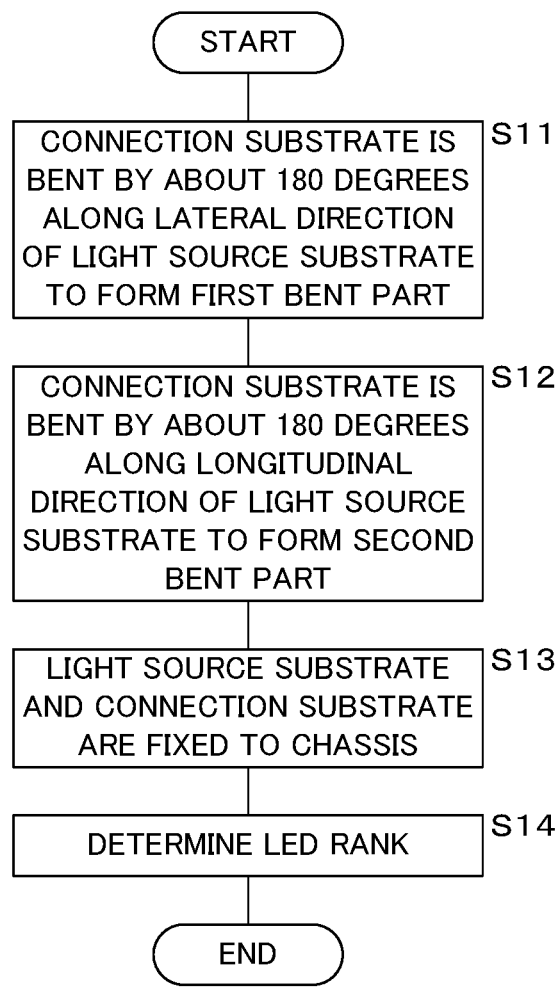
FIG. 5 is a process chart illustrating an example of a method of manufacturing a light source device using a first example of the substrate unit of the present embodiment.

FIG. 5 is a process chart illustrating an example of a method of manufacturing a light source device using the first example of the substrate unit of the present embodiment. Hereinafter, the process will be described in conjunction with FIG. 3. As illustrated in FIG. 5, the connection substrate is bent by about 180 degrees along the lateral direction of the light source substrate 21 to form a first bent part (S11). In the example of FIG. 3A, the extension part 243 (connection substrate 24) is bent by about 180 degrees (bent as illustrated by a symbol B in FIG. 3A) along the lateral direction (the direction illustrated by the symbol Y in FIG. 3A) of the light source substrate 21 to form the first bent part 241. Thereby, as illustrated in FIG. 3B, the pair of light source substrates 21 may be disposed at the positions in which the respective diagonal lines thereof are on substantially the same imaginary straight line as each other. In addition, the connection substrate 24 which is bent by the first bent part 241 has an S shape in a plan view.

Next, the connection substrate is bent by about 180 degrees along the longitudinal direction of the light source substrate 21 to form a second bent part (S12). In the example of FIG. 3B, the connection part 245 (connection substrate 24) is bent by about 180 degrees (bent as illustrated by a symbol C in FIG. 3B) along the longitudinal direction (direction illustrated by the symbol X in FIG. 3B) of the light source substrate 21 to form the second bent part 242. Thus, as illustrated in FIG. 3C, the light source substrates 21 may be linearly disposed with the connection substrate 24 in between, and the light source substrates may be elongated. In addition, the connection substrate 24 which is bent by the second bent part 242 is formed in a rectangular shape in a plan view.

As described above, in the substrate unit, since the short side edge parts 211 of each of the pair of light source substrates 21 are connected by the connection substrate 24 having a flexibility, by bending the connection substrate 24 of the fabricated substrate unit along a required direction, it is possible to elongate the light source substrates without using a relay connector.

Next, the light source substrates 21 and the connection substrate 24 (for example, the substrate unit illustrated in FIGS. 2 and 3C) are fixed to a chassis (for example, the backlight chassis 10) (S13). The rank is determined by reading the labels attached to the pair of light source substrates 21 (S14). For example, the determination of the rank is a step of determining a range to which values of the luminance, shade (chromaticity, etc.) and the like of the LED belong to. When attaching a plurality of light source substrates 21 to one backlight chassis 10, it is preferable to collectively use the LEDs having the same rank as each other. Further, in the present embodiment, it is sufficient to perform the determination of the rank for each pair of light source substrates, such that it is possible to reduce the determination frequency to one half as compared with the case of determining the rank for each light source substrate, as well as, it is possible to improve working efficiency or reduce the number of processes.

As described above, in the method of manufacturing the light source device (backlight unit) of the present embodiment, the substrate unit, in which the short side edge parts 211 (end parts) of the respective light source substrates 21 are connected by the flexible connection substrate 24 having a flexibility, so that the long side edge parts 212 of the pair of the elongated light source substrates 21 on which the LEDs 22 are mounted face each other, is used. In addition, the method of manufacturing the light source device includes the steps of bending the connection substrate 24 by about 180 degrees along one direction (for example, the lateral direction) of the lateral direction and the longitudinal direction of the light source substrate 21; bending the connection substrate 24 which is bent in the above step by about 180 degrees along the other direction (for example, the longitudinal direction) of the lateral direction and the longitudinal direction of the light source substrate 21; and fixing the connection substrate 24 which is bent in the above step and the light source substrates 21 connected by the connection substrate 24 to the backlight chassis 10 as a prescribed fixing plate.

By bending the connection substrate 24 by about 180 degrees along the lateral direction of the light source substrate 21, the pair of light source substrates 21 whose long side edge parts 212 face each other may be disposed at the positions in which the respective diagonal lines thereof are on substantially the same imaginary straight line as each other. Next, by bending the connection substrate 24 by about 180 degrees along the longitudinal direction of the light source substrate 21, it is possible to linearly dispose the light source substrates 21 with the connection substrate 24 in between, and elongate the light source substrates.

In the above-described embodiment, the bending order of the connection substrate 24 may be bent initially along the lateral direction of the light source substrate 21, or may be bent initially along the longitudinal direction of the light source substrate 21.

Figure 6A:
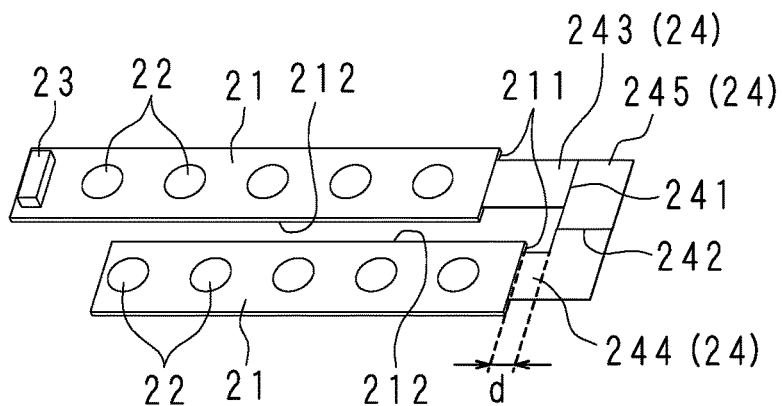
FIG. 6A is an explanatory view illustrating an example of a bending procedure of a second example of the substrate unit of the present embodiment.
Figure 6B:
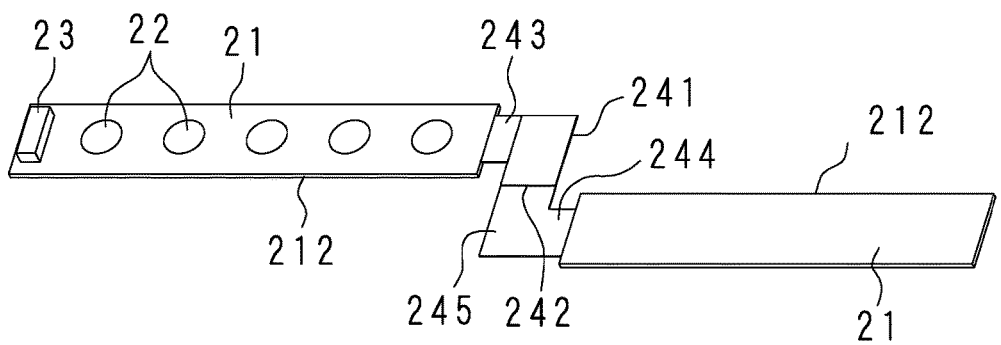
FIG. 6B is an explanatory view illustrating an example of the bending procedure of the second example of the substrate unit of the present embodiment.
Figure 6C:
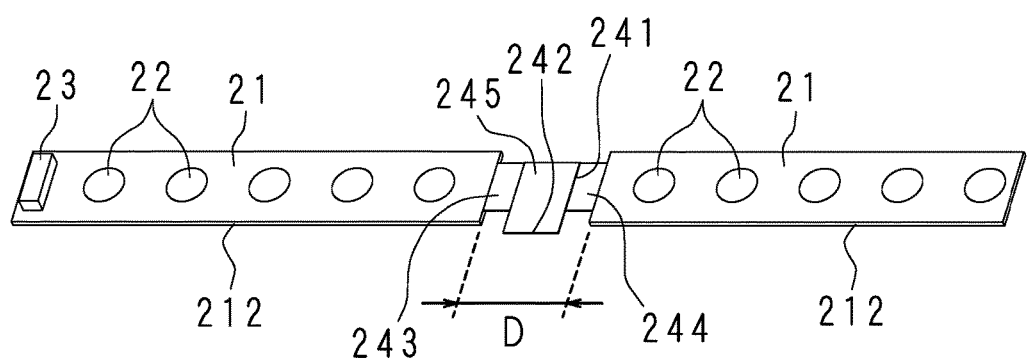
FIG. 6C is an explanatory view illustrating an example of the bending procedure of the second example of the substrate unit of the present embodiment.

FIGS. 6A, 6B and 6C are explanatory views illustrating an example of a bending procedure of a second example of the substrate unit of the present embodiment. FIG. 6A illustrates the substrate unit in the state before bending. A difference from the first example illustrated in FIGS. 3A to 3C is that a dimension of the extension part 244 of the second example (the dimension illustrated by a symbol d) in the longitudinal direction of the light source substrate 21 is shorter than that in the case of the first example. That is, the lengths of the respective extension parts 243 and 244 in the longitudinal direction of the light source substrate 21 are different from each other. Briefly, a connection substrate 24 is formed in a J shape in a plan view, in the state before bending. By shortening the length of one extension part 244 (which does not have a bent part) than the length of the other extension part 243 having a first bent part 241, a spaced dimension therebetween in the longitudinal direction of the light source substrate 21 may be adjusted (shortened).

For example, as illustrated in FIG. 6C, it is possible to more shorten the spaced dimension (illustrated by a symbol D) between the light source substrates 21 than the case of the first example, and adjust a pitch (mounting interval) of the LEDs over two light source substrates 21 with respect to the pitch of the LEDs on one light source substrate 21.

Figure 7A:
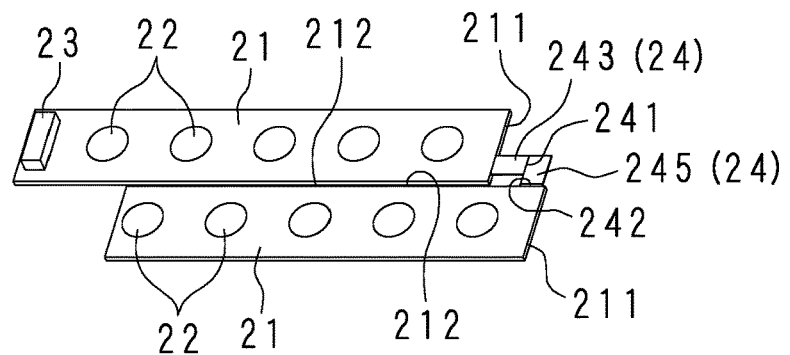
FIG. 7A is an explanatory view illustrating an example of a bending procedure of a third example of the substrate unit of the present embodiment.
Figure 7B:
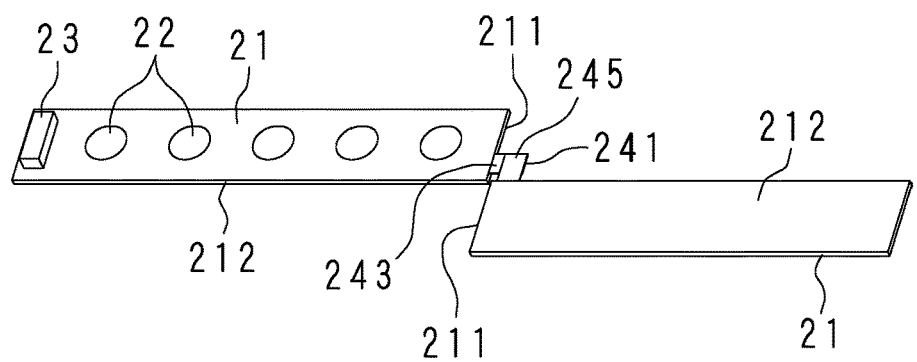
FIG. 7B is an explanatory view illustrating an example of the bending procedure of the third example of the substrate unit of the present embodiment.
Figure 7C:
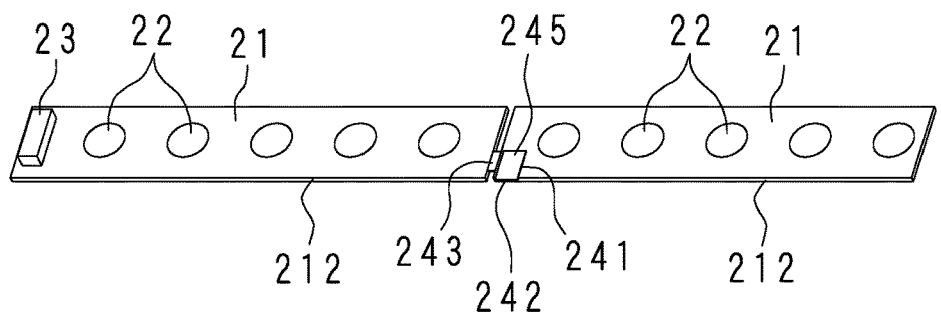
FIG. 7C is an explanatory view illustrating an example of the bending procedure of the third example of the substrate unit of the present embodiment.

FIGS. 7A, 7B, and 7C are explanatory views illustrating an example of a bending procedure of a third example of the substrate unit of the present embodiment. FIG. 7A illustrates the substrate unit in the state before bending. In the third example, a connection substrate 24 has an extension part 243 which extends to be connected to the short side edge part 211 of one light source substrate 21, and a connection part 245 which connects the extension parts 243 and a short side of the long side edge part 212 of the other light source substrate 21, in the state before bending.

That is, in the state before bending, the connection substrate 24 has the connection part 245 along the lateral direction of the light source substrate 21, and the extension part 243 connected from one end side of the connection part 245, wherein the extension part 243 is connected to the short side edge part 211 of one light source substrate 21, and the connection part 245 is connected to the short side of the long side edge part 212 of the other light source substrate 21, and is formed in an L shape in a plan view. The extension part 243 has a first bent part 241 that is bendable along the lateral direction of the light source substrate 21, and the connection part 245 has a second bent part 242 that is bendable along the longitudinal direction of the light source substrate 21.

In a state in which the long side edge parts 212 of the light source substrates 21 are connected to each other through the connection substrate 24 (in the state of before bending), first, the extension part 243 connected to one light source substrate 21 is bent (by about 180 degrees) in the lateral direction of the light source substrate 21 to form the first bent part 241. Thereby, the pair of light source substrates 21 may be disposed at the positions in which the respective diagonal lines thereof are on substantially the same imaginary straight line as each other.

Next, the connection part 245 is bent (by about 180 degrees) along the longitudinal direction of the light source substrate 21 to form the second bent part 242. Thereby, the light source substrates 21 may be linearly disposed with the connection substrate 24 in between, and the light source substrates 21 may be elongated. In addition, since the connection part 245 is connected to the short side of the long side edge part 212 of the other light source substrate 21, the spaced dimension in the longitudinal direction of the light source substrate 21 may be more shortened than the case of being connected to the short side edge part 211 of the light source substrate 21.

Thereby, as illustrated in FIG. 7C, the spaced dimension between the light source substrates 21 may be more shortened than the case of the second example, and the pitch of the LEDs over the two light source substrates 21 may be decreased.

Figure 8A:
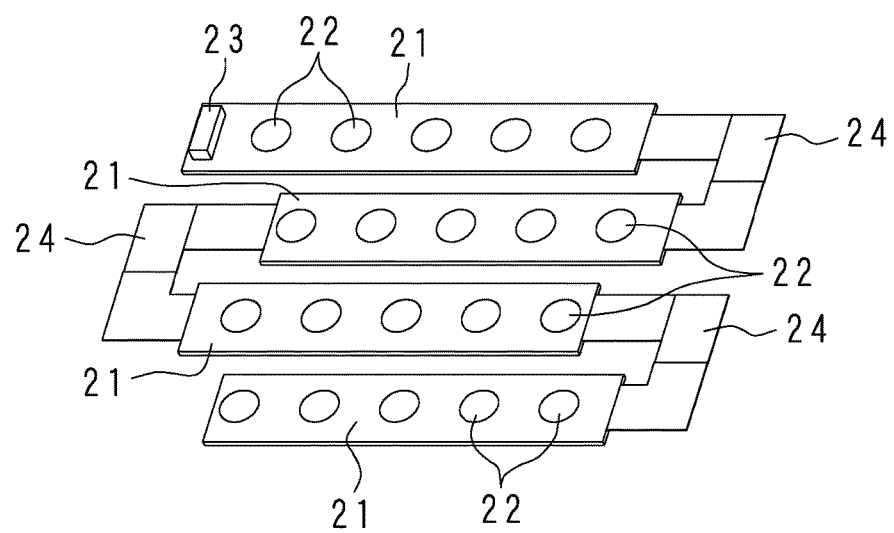
FIG. 8A is an explanatory view illustrating an example of a bending procedure of a fourth example of the substrate unit of the present embodiment.
Figure 8B:
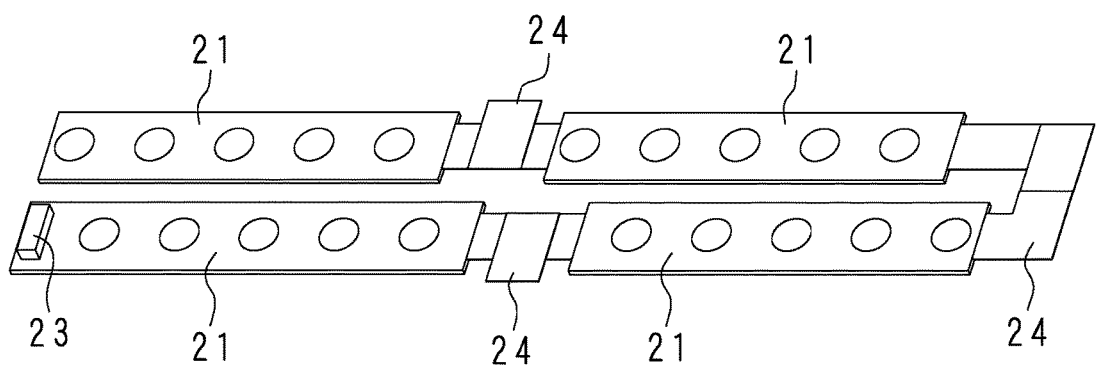
FIG. 8B is an explanatory view illustrating an example of the bending procedure of the fourth example of the substrate unit of the present embodiment.

FIGS. 8A and 8B are explanatory views illustrating an example of a bending procedure of a substrate unit of a fourth example of the present embodiment. FIG. 8A illustrates the substrate unit in the state before bending. In the fourth example, unlike the first to third examples, the substrate unit includes four light source substrates 21 and three connection substrates 24.

That is, as illustrated in FIG. 8A, the four light source substrates 21 are disposed in a state in which the long sides of the light source substrates 21 face each other. In addition, the inner two light source substrates 21 are connected to the connection substrates 24 at both of end parts. Similar to the first to third examples, by bending a part of the connection substrate 24, it is possible to have a multicolumn and multistage configuration (two stages in the example of FIG. 8B) as exemplified in FIG. 8B.

The above-described embodiments have the configuration in which the connection substrate 24 having a flexibility is fabricated by a separate flexible printed wiring board (FPC), etc., and the light source substrates 21 are connected to each other through the connection substrate by soldering or a means such as anisotropic conductive film (ACF) to elongate the light source substrates, but it is not limited thereto. For example, by laminating flexible substrates, the light source substrates and the connection substrate may be fabricated, and by reducing the number of laminated portions corresponding to the connection substrate, the connection substrate may have a flexibility so as to be bendable.

As described above, according to the present embodiment, the light source substrates are disposed and fabricated so that the long side edge parts thereof face each other on the motherboard, and when assembling the light source device, by bending the connection substrate connecting the light source substrates along the prescribed direction, the light source substrates may be elongated (for example, it may have a length twice of the length of one light source substrate) without causing an increase in costs. In addition, since the connection substrate is used for connecting the light source substrates, a conduction failure due to the connector may not occur, and a separate relay connector is not required, thereby an increase in the costs may be suppressed. Further, according to the present embodiment, it is possible to achieve a display apparatus that may elongate the light source substrate without using a relay connector.

In the above-described embodiments, the lengths of each of the pair of light source substrates are substantially the same as each other, but the lengths of the respective light source substrates are not limited to the case of being the same as each other, and may be different from each other.

In the above-described embodiments, as the light source device, the example of the backlight unit has been described, but it is not limited to the backlight unit, and the light source device may be provided, for example, in an advertisement apparatus, an information display apparatus, and the like, so long as it is an apparatus using the elongated light source substrate.

It is to be noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A light source device comprising:
a substrate unit changeable from a first shape in which a length in a predetermined direction is a first length to a second shape in which a length in the predetermined direction is a second length longer than the first length, wherein the substrate unit comprises:
a plurality of light source substrates including a first light source substrate and a second light source substrate which are elongated light source substrates long in the predetermined direction on which light sources are mounted; and
a connection substrate which has a flexibility and connects a first edge part on one end side in the longitudinal direction of the first light source substrate and a second edge part on one end side in the longitudinal direction of the second light source substrate,
wherein the connection substrate comprises:
a first extension part which is extended to the first edge part along the longitudinal direction of the first light source substrate and to be connected to the first edge part,
a second extension part which is extended to the second edge part along the longitudinal direction of the second light source substrate and to be connected to the second edge part,
a connection part which connects the first extension part and the second extension part,
a first bent part at which the first extension part can be bent along a direction orthogonal to a longitudinal direction of the first light source substrate; and
a second bent part at which the connection part can be bent along the longitudinal direction of the first light source substrate,
wherein the connection substrate connects the first edge part and the second edge part so that a third edge part along the longitudinal direction of the first light source substrate and a fourth edge part along the longitudinal direction of the second light source substrate face each other, in the state of the first shape, and so that the first edge part and the second edge part face each other, in the state of the second shape, and
wherein the substrate unit is deformed from the first shape into the second shape as the connection substrate is bent at the first bent part and the second bent part.

2. The light source device according to claim 1, wherein an extended length of the first extension part is longer than an extended length of the second extension part.

3. The light source device according to claim 2, wherein a distance from the first edge part to the connection part is equal to a distance from the second edge part to the connection part, in the state of the second shape.

4. A display apparatus comprising:
the light source device according to claim 1; and
a display panel configured to transmit light emitted by the light source device.

5. The light source device according to claim 1, wherein the second length is longer than a value multiplied by a length in the longitudinal direction of the light source substrate and a number of the plurality of the light source substrates.

6. The light source device according to claim 1, wherein the first length is shorter than twice the length in the longitudinal direction of the light source substrate.

7. A light source device comprising:
a substrate unit changeable from a first shape in which a length in a predetermined direction is a first length to a second shape in which a length in the predetermined direction is a second length longer than the first length, wherein the substrate unit comprises:
a plurality of light source substrates including a first light source substrate and a second light source substrate which are elongated light source substrates long in the predetermined direction on which light sources are mounted; and
a connection substrate which has a flexibility and connects a first edge part on one end side in the longitudinal direction of the first light source substrate and a fourth edge part along the longitudinal direction of the second light source substrate,
wherein the connection substrate comprises:
a first extension part which is extended to the first edge part along the longitudinal direction of the first light source substrate and to be connected to the first edge part,
a connection part which connects the first extension part and the fourth edge part,
a first bent part at which the first extension part can be bent along a direction orthogonal to a longitudinal direction of the first light source substrate; and
a second bent part at which the connection part can be bent along the longitudinal direction of the first light source substrate,
wherein the connection substrate connects the first edge part and the fourth edge part so that a third edge part along the longitudinal direction of the first light source substrate and the fourth edge part face each other, in the state of the first shape, and so that the first edge part and a second edge part on one end side in the longitudinal direction of the second light source substrate face each other, in the state of the second shape, and
wherein the substrate unit is deformed from the first shape into the second shape as the connection substrate is bent at the first bent part and the second bent part.

8. A display apparatus comprising:
the light source device according to claim 7; and
a display panel configured to transmit light emitted by the light source device.

9. The light source device according to claim 7, wherein a distance from the first edge part to the second edge part is shorter than a distance from the first edge part to the first bent part, in the state of the second shape.

10. The light source device according to claim 7, wherein the second length is longer than a value multiplied by a length in the longitudinal direction of the light source substrate and a number of the plurality of the light source substrates.

11. The light source device according to claim 7, wherein the first length is shorter than twice the length in the longitudinal direction of the light source substrate.

* * * * *